(12) United States Patent
Kashiwabara (10) Patent No.: US 8,070,545 B2
(45) Date of Patent: Dec. 6, 2011

(54) METHOD FOR FABRICATING ELECTROLUMINESCENT ELEMENT

(75) Inventor: Mitsuhiro Kashiwabara, Yokohama (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 978 days.

(21) Appl. No.: 10/487,179

(22) PCT Filed: Nov. 27, 2002

(86) PCT No.: PCT/JP02/12386
§ 371 (c)(1),
(2), (4) Date: Feb. 18, 2004

(87) PCT Pub. No.: WO2004/049766
PCT Pub. Date: Jun. 10, 2004

(65) Prior Publication Data
US 2005/0079787 A1 Apr. 14, 2005

(51) Int. Cl.
*H05B 33/10* (2006.01)
(52) U.S. Cl. .............. 445/24; 445/25; 427/66
(58) Field of Classification Search .......... 445/24–25; 428/690; 427/66
See application file for complete search history.

(56) References Cited

U.S. PATENT DOCUMENTS
5,953,585 A * 9/1999 Miyaguchi ............ 438/35
6,171,765 B1   1/2001 Sheats FOREIGN PATENT DOCUMENTS
| JP | 11-144865 A | 5/1999 |
| JP | 2000-113981 A | 4/2000 |
| JP | 2001-217078 A | 8/2001 |
| JP | 2002-170673 A | 6/2002 |
| WO | WO97/38445 | 10/1997 |

OTHER PUBLICATIONS

European Search Report: PCT/JP0212386.

* cited by examiner

*Primary Examiner* — Nimeshkumar Patel
*Assistant Examiner* — Mary Ellen Bowman
(74) *Attorney, Agent, or Firm* — Ladas & Parry LLP (57) ABSTRACT

A method for manufacturing an electro luminescent element includes a process of forming a light emitting layer and a photoresist layer in this order, on the base substance; a process of pattern exposing and then developing the photoresist layer, so as to the part corresponding to a predetermined light emitting part of the photoresist layer remains; a process of forming a light emitting part which its surface is covered with the photoresist layer, by removing the light emitting layer which is bared because the photoresist layer is removed; a process of forming a photoresist layer on the base substance, so as to cover the light emitting part; and a process of pattern exposing and then developing the photoresist layer, so as not to bare the light emitting part and the end part thereof.

8 Claims, 5 Drawing Sheets

METHOD FOR FABRICATING ELECTROLUMINESCENT ELEMENT

CROSS REFERENCE TO THE RELATED APPLICATION

This application is a U.S. National Phase of International Patent Application Number PCT/JP02/12386, filed Nov. 27, 2002.

TECHNOLOGICAL FIELD

The present invention relates to a method for manufacturing an organic electroluminescent (hereinafter it may be abbreviated as EL) element with an organic EL layer formed as a pattern by a photolithography method.

BACKGROUND TECHNOLOGY

An EL element couples a hole and an electron, injected from counter electrodes, in a light emitting layer, excites the fluorescent substance in the light emitting layer by the energy, and emits a light of the color corresponding to the fluorescent substance, attracts the attention as a self light emitting flat display element. In particular, an organic thin film EL display using an organic substance as a light emitting material has a high light emitting efficiency and capable of realizing a high luminance light emission even with less than 10 V applied voltage, capable of emitting a light in a simple element structure, and thus application thereof to the advertisement of displaying a specific pattern by light emission and other inexpensive simple displays is expected.

In the manufacturing of the display using such EL element, in general, an electrode layer and an organic EL layer are patterned. As methods for patterning the EL element, a method of deposition of the light emitting material via a shadow mask, a method of divisional coating by ink jetting, a method of destroying a specific light emitting dye by the ultraviolet ray irradiation, a screen printing method, or the like can be presented. However, in these methods, it was impossible to provide a method for manufacturing an EL element, capable of realizing all of, a high light emitting efficiency, a high light taking out efficiency, a simple manufacturing process, and a high precision pattern formation.

As means for solving these problems, a method for manufacturing an EL element of forming a light emitting layer by patterning using a photolithography method has been proposed. According to the method, compared with the conventionally conducted patterning method by the deposition, since a vacuum equipment comprising a highly accurate alignment mechanism, or the like is not needed, manufacturing can be conducted relatively easily and inexpensively. In contrast, compared with the patterning method using the ink jet method, it is preferable in that a pre-process to a structure, base substance, or the like for aiding patterning, is not conducted. Furthermore, from the relationship with the ejection accuracy of an ink jet head, the photolithography method is considered as a more preferable method for a high precision pattern formation, and thus it is advantageous.

As a method for forming a plurality of light emitting parts by such photolithography method, for example, a method shown in FIG. 5 has been proposed.

Figure 5A:
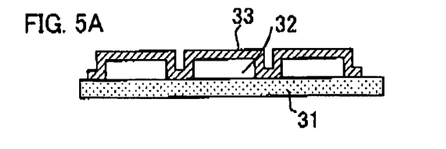
Figure 5B:
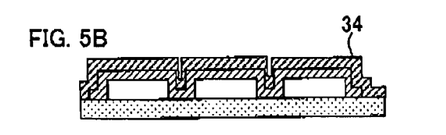
Figure 5C:
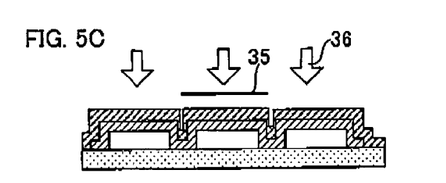

First, as shown in FIG. 5A, a patterned first electrode layer 32 is formed on a base substance 31, and furthermore, a first light emitting layer coating solution 33 is coated on the entire surface thereon. Then, as shown in FIG. 5B, a positive type resist 34 is coated on the entire surface, and as shown in FIG. 5C, masking only the part, which a first light emitting part is to be formed, with a photomask 35, it is exposed with an ultraviolet ray 36 excluding the part.

Figure 5D:
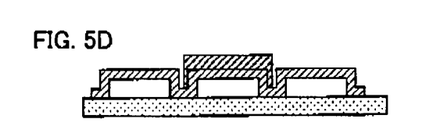
Figure 5E:
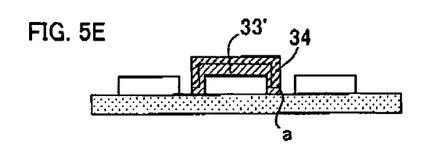

By developing the same with a resist developing agent and cleaning with water, the resist in the exposed part is removed a shown in FIG. 5D. Furthermore, by developing with a solvent of the light emitting layer, as shown in FIG. 5E, the bared first light emitting layer 33 is removed, so that the resist and a first light emitting part 33' covered with the resist remain.

Figure 5F:
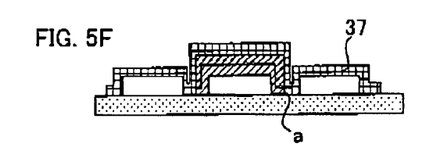

Then, by the same method for forming the first light emitting part 33', as shown in FIG. 5F, a second light emitting layer coating solution 37 is coated on the entire surface. At the time, as it is apparent from FIG. 5F, there is a part where the second light emitting layer coating solution 37 coated on the entire surface and the first light emitting part 33' are contacted with each other. That is, as mentioned above, the first light emitting part 33' remaining on the base substance 31 has its surface covered with the positive type resist, but the end part "a" developed with the light emitting layer developing agent is bared. Therefore, when the second light emitting layer coating solution 37 is coated thereon, the first light emitting part 33' and the second light emitting layer coating solution are contacted at the end part "a". At the time, there is a problem of generating troubles of color mixture or pixel narrowing due to elution of the first light emitting part into the second light emitting layer coating solution.

Figure 5G:
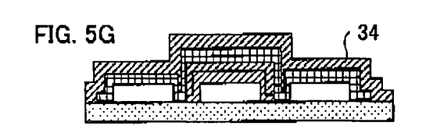
Figure 5H:
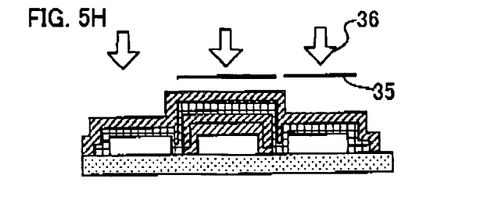

Furthermore, as shown in FIG. 5G, the positive type resist 34 is coated on the entire surface, and as shown in FIG. 5H, masking the parts, which the first and second light emitting parts are to be formed, with the photomask 35, the other part is exposed with the ultraviolet ray 36.

Figure 5I:
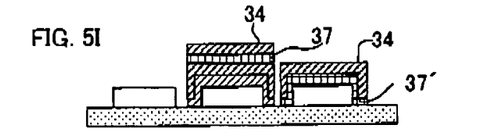

By developing the same with a resist developing agent, cleaning with water, and furthermore, developing with a solvent of the light emitting layer, as shown in FIG. 5I, only the bared second light emitting layer 37 is removed so that a second light emitting part 37' covered with the resist 34 is formed.

Figure 5J:
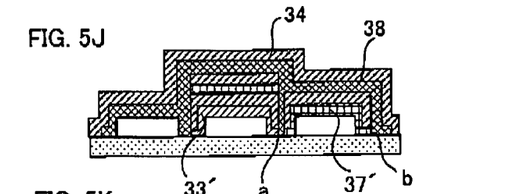

Furthermore, by the same method for forming the first and second light emitting parts, as shown in FIG. 5J, a third light emitting layer coating solution 38 is coated. At the time, as it is apparent from FIG. 5J, the first light emitting part and the third light emitting layer coating solution are contacted at the end part "a" of the first light emitting part 33' formed initially, and furthermore, the second light emitting part and the third light emitting layer coating solution are contacted at the end part "b" of the second light emitting part 37'. Similarly, at the time, there is a possibility of generating troubles of color mixture, pixel narrowing, or the like due to elution of the first light emitting part 33' and the second light emitting part 37' into the third light emitting layer coating solution.

Figure 5K:
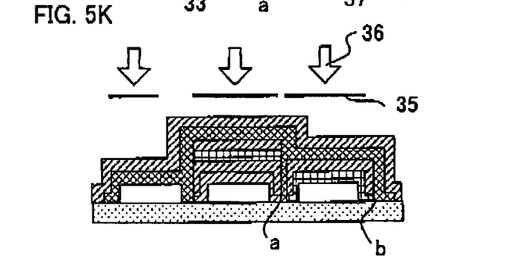

Furthermore, as shown in FIG. 5K, the positive type resist 34 is coated on the entire surface, and masking the parts, which the first, second and third light emitting parts are to be formed, with the photomask 35, the other part is exposed with the ultraviolet ray 36.

Figure 5L:
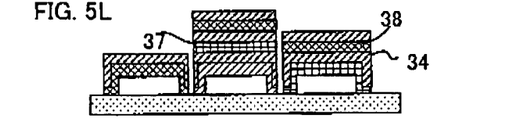
Figure 5M:
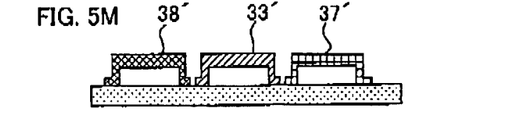

By developing the same with a resist developing agent, cleaning with water, and developing with a solvent of the light emitting layer, as shown in FIG. 5L, only the bared third light emitting layer 38 is removed so that only the part covered with the resist remains. Furthermore, by conducting a peeling treatment with a resist peeling solution, the layers above the part which the resist is formed are peeled off so that the light emitting parts of three colors including the first light emitting part 33', the second light emitting part 37' and the third light emitting part 38' are formed in a bared state as shown in FIG. 5M.

Figure 5N:
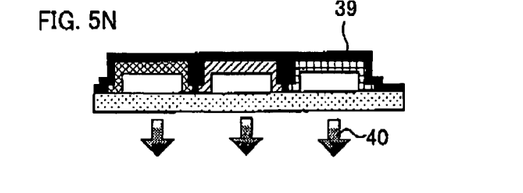

Finally, as shown in FIG. 5N, by forming a second electrode layer 39 on these light emitting parts, an EL element which discharges an EL light emission 40 to the lower direction in the figure can be manufactured.

As mentioned above, according to the photolithography method, since the patterned end part "a" of the first light emitting part and the end part "b" of the second light emitting part are not covered with the photoresist layer, there is a problem that the patterned light emitting parts elute into the light emitting layer coating solution to be coated later at the end part thereof so as to generate color mixture and pixel narrowing at the time of coating the subsequent light emitting layer coating solution.

DISCLOSURE OF THE INVENTION

The present invention has been achieved in view of the above-mentioned problems, and the main object thereof is to provide a method for manufacturing an EL element by the photolithography method having advantages of the photolithography method of high light emitting efficiency, high taking out efficiency, a simple manufacturing process, and the high precision pattern formation, and also capable of preventing color mixture of the end part of the pattern formed light emitting part, and the different light emitting layer which is laminated later, and furthermore, preventing the pixel narrowing.

In order to achieve the above-mentioned object, the present invention provides a method for manufacturing an electroluminescent element of forming a plurality of kinds of light emitting parts on a base substance by patterning light emitting layers of different kinds by a plurality of times by the photolithography method, on the base substance with an electrode layer formed, comprising; a process of forming a light emitting layer and a photoresist layer in this order, on the base substance; a process of pattern exposing and then developing the photoresist layer, so as to the part corresponding to a predetermined light emitting part of the photoresist layer remains; a process of forming a light emitting part which its surface is covered with the photoresist layer, by removing the light emitting layer which is bared because the photoresist layer is removed; a process of forming a photoresist layer on the base substance, so as to cover the light emitting part; and a process of pattern exposing and then developing the photoresist layer, so as not to bare the light emitting part and the end part thereof.

In the present invention, since the patterned light emitting part is covered with the photoresist layer so as not to be bared, the light emitting part formed already is not contacted with the light emitting layer coating solution to be coated later, and thus pixel narrowing and color mixture generated by the contact, of the light emitting part and the light emitting layer coating solution, can be prevented.

In the present invention, it is preferable that a process of peeling off the photoresist layer remaining on the light emitting part is conducted, and then a process of forming a photoresist layer is conducted after the process of forming the light emitting part. When the subsequent photoresist is coated on the photoresist layer formed earlier in pile, sometimes it is difficult to form the photoresist layer in good condition. Therefore, the photoresist layer is formed on the entire surface after preliminarily removing the photoresist layer.

Moreover, the present invention provides A method for manufacturing an electroluminescent element of forming a plurality of kinds of light emitting parts on a base substance by patterning light emitting layers of different kinds by a plurality of times by the photolithography method, on the base substance with an electrode layer formed, comprising; a process of forming a light emitting layer and a photoresist layer in this order, on the base substance; a process of pattern exposing and then developing the photoresist layer, so as to the part corresponding to all of the light emitting part of the photoresist layer remains; a process of forming a light emitting part which its surface is covered with the photoresist layer, by removing the light emitting layer which is bared because the photoresist layer is removed; a process of forming a photoresist layer on the base substance, so as to cover the light emitting part; and a process of pattern exposing and then developing the photoresist layer, so as not to bare the predetermined light emitting part and the end part thereof; a process of removing the light emitting part which is bared because the photoresist layer is removed.

Also in this case, as in the above mentioned case, since the patterned light emitting part is covered with the photoresist layer so as not to be bared, the light emitting part formed already is not contacted with the light emitting layer coating solution to be coated later, and thus color mixture generated by the contact, of the light emitting part and the light emitting layer coating solution, can be prevented. Then, furthermore, the electrode layer is always in a state covered with the light emitting part at the time of developing the photoresist layer. Therefore, even when an organic EL layer such as a buffer layer is formed on the electrode layer, since the organic EL layer is not contacted with the developing agent of the photoresist layer, it is advantageous in that an organic EL layer which is soluble in the solvent or the developing agent of the photoresist layer can be used.

At the time, it is preferable that a process of peeling off the photoresist layer remaining on all of the light emitting part is conducted, and then a process of forming a photoresist layer is conducted, after the process of forming the light emitting part. Similarly as in the above mentioned case, when the subsequent photoresist is coated on the photoresist layer formed earlier in pile, it is difficult to form the photoresist layer in good condition, and a trouble generated by a photoresist layer in good condition is not formed, can be solved.

Moreover, in both of the above mentioned methods for manufacturing an EL element, it is preferable that the process of removing the light emitting layer or light emitting part which is bared because the photoresist layer is removed, is a process of removing by dry etching. By using a method of removing the light emitting layer by dry etching accordingly, higher precision pattern can be formed.

According to the present invention, since the patterned light emitting part is covered with the photoresist layer so as not to be bared, the light emitting part formed already is not contacted with the light emitting layer coating solution to be coated later, and thus the effect, of preventing color mixture and pixel narrowing generated by the contact of the light emitting part and the light emitting layer coating solution, can be provided.

BRIEF DESCRIPTION OF THE DRAWINGS

FIG. 1 is a process diagram showing a first example of a first embodiment according to the method for manufacturing an EL element of the present invention.

FIG. 2 is a process diagram showing a second example of the first embodiment according to the method for manufacturing an EL element of the present invention.

FIG. 3 is a process diagram showing a first example of a second embodiment according to the method for manufacturing an EL element of the present invention.

FIG. 4 is a process diagram showing a second example of the second embodiment according to the method for manufacturing an EL element of the present invention.

FIG. 5 is a process diagram showing the conventional method for manufacturing an EL element.

BEST MODE FOR CARRYING OUT THE INVENTION

The method for manufacturing an EL element of the present invention can be divided roughly into two embodiments. Hereinafter, the method for manufacturing an EL element of the present invention will be explained in detail for each embodiment.

A. First Embodiment

A first embodiment of the present invention is a method for manufacturing an electroluminescent element of forming a plurality of kinds of light emitting parts on a base substance by patterning light emitting layers of different kinds by a plurality of times by the photolithography method, on the base substance with an electrode layer formed, comprising at least the following processes.
(1) A process of forming a light emitting layer and a photoresist layer in this order, on the base substance (light emitting layer and primary photoresist layer forming process).
(2) A process of pattern exposing and then developing the photoresist layer, so as to the part corresponding to a predetermined light emitting part of the photoresist layer remains (primary photoresist layer developing process).
(3) A process of forming a light emitting part which its surface is covered with the photoresist layer, by removing the light emitting layer which is bared because the photoresist layer is removed (light emitting layer developing process).
(4) A process of forming a photoresist layer on the base substance, so as to cover the light emitting part (secondary photoresist layer forming process).
(5) A process of pattern exposing and then developing the photoresist layer, so as not to bare the light emitting part and the end part thereof (secondary photo resist layer developing process).

For each of these processes, using FIG. 1 which shows the first example of this embodiment, formation of the first light emitting part (FIGS. 1A to 1E) will be explained briefly.

Figure 1A:
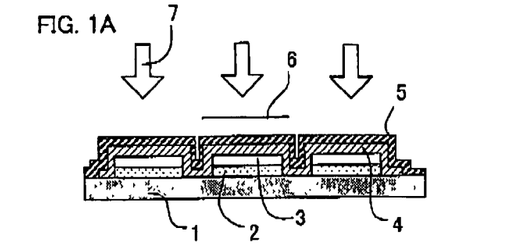

In the first example of this embodiment, first, as shown in FIG. 1A, a first light emitting layer coating solution is coated on the entire surface of a first electrode layer 2 patterned on a base substance 1 and a buffer layer 3 formed thereon, using the spin coating method, or the like. By drying and curing the first light emitting layer coating solution coated on the entire surface, a first light emitting layer 4 is formed. Then, by coating a positive type photoresist on the entire surface on the first light emitting layer 4, a primary photoresist layer 5 is formed (light emitting layer and primary photoresist layer forming process).

Next, an ultraviolet ray 7 is irradiated as a pattern using a primary photomask 6 so as not to expose the part corresponding to the first light emitting part (FIG. 1A). Then, by developing the exposed part of the primary photoresist layer 5 with a photoresist developing agent and cleaning the same with water, the exposed part of the primary photoresist layer 5 is removed (primary photoresist layer developing process).

Figure 1B:
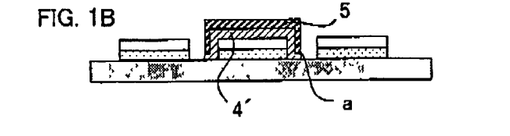

Furthermore, by developing with a light emitting layer developing agent, only the part which is not covered with the primary photoresist layer 5 of the light emitting layer 4 is removed (FIG. 1B, light emitting layer developing process).

Figure 1C:
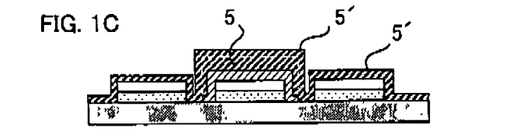

Then, as shown in FIG. 1C, by further coating the entire surface and superimposing a positive type photoresist thereon, a secondary photoresist layer 5' is formed (secondary photoresist layer forming process).

Figure 1D:
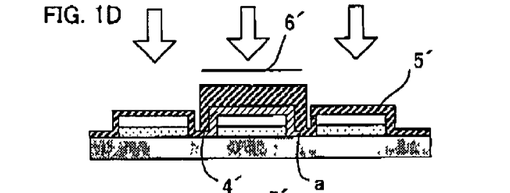
Figure 1E:
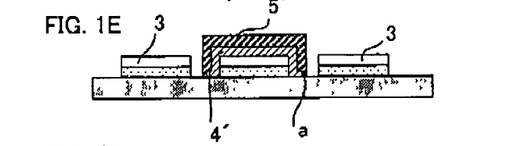

Next, using a secondary photomask 6' having a wider width than that of the primary photomask 6 used for masking the primary photoresist layer shown in FIG. 1A, exposure is carried out with the ultraviolet ray 7 (FIG. 1D). Then, by developing the exposed part of the secondary photoresist layer 5 with a photoresist developing agent and cleaning with water, as shown in FIG. 1E, a first light emitting part 4' and a secondary photoresist layer 5' covering the end part "a" thereof are formed (secondary photoresist layer developing process).

By thus conducting two times of the photoresist developing processes for the primary photoresist layer and the secondary photoresist layer at the time of patterning one light emitting layer, the next coating process of the second light emitting layer coating solution for forming the second light emitting part can be done in a state with the end part "a" of the first light emitting part 4' covered with the photoresist layer. Therefore, a problem of color mixture, or the like is not generated even when the next second light emitting layer coating solution is coated.

Figure 1F:
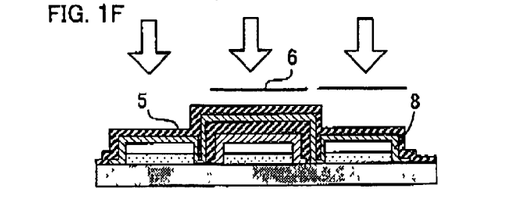
Figure 1G:
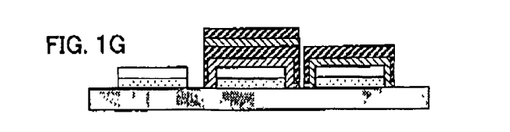
Figure 1H:
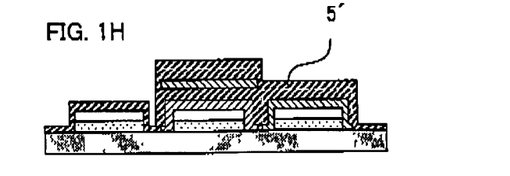
Figure 1I:
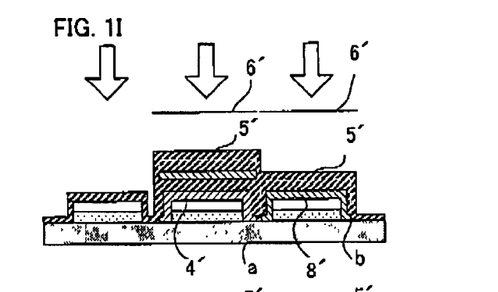
Figure 1J:
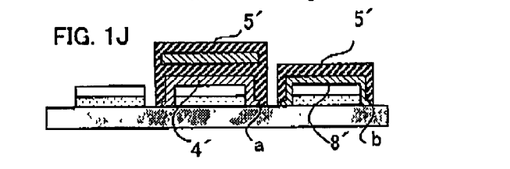
Figure 1K:
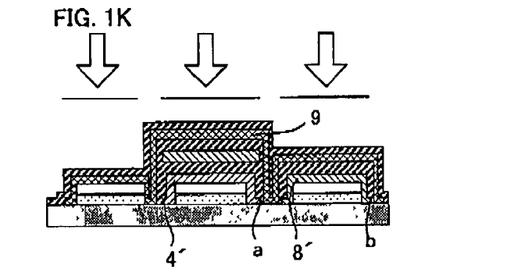
Figure 1L:
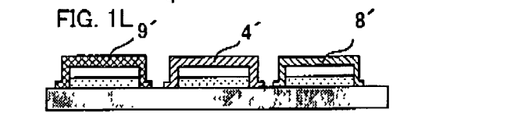
Figure 1M:
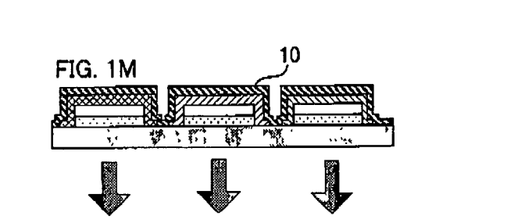
Figure 2A:
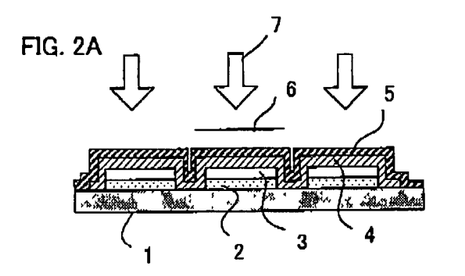
Figure 2B:
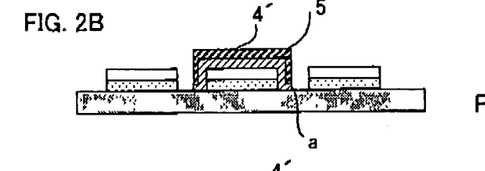
Figure 2C:
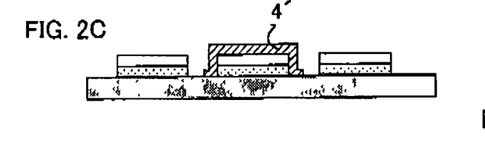
Figure 2D:
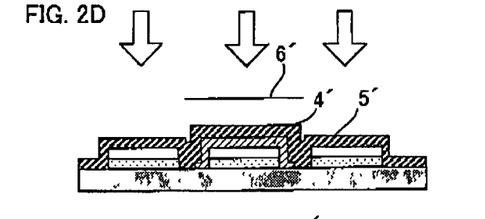
Figure 2E:
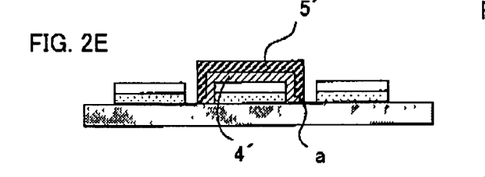
Figure 2F:
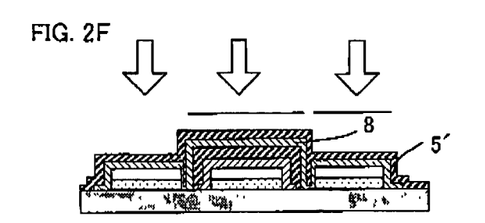

FIG. 2 shows formation up to the first light emitting part in the second example of this embodiment (FIG. 2A to 2E). In this example, the processes of FIG. 1B, that is, the process up to developing the primary photoresist layer 5 and developing the first light emitting layer (light emitting layer developing process) are exactly same (see FIG. 2B). In this example, a process of peeling off the developed primary photoresist layer 5 is then conducted (primary resist peeling process, see FIG. 2C). Next, by forming the secondary photoresist layer 5' on the entire surface of the base substance with all the primary photoresist layer removed and the first light emitting part 4' bared, and conducting exposure using the secondary photomask 6' as in the example of FIG. 1 (see FIG. 2D), the secondary photoresist layer 5' is formed widely such that the end part "a" of the first light emitting part 4' is covered with the secondary photoresist layer 5' so as not to be bared (FIG. 2E).

In the method of this example, although the process of a photoresist layer peeling process should be conducted additionally between the light emitting layer developing process and the secondary photoresist layer forming process, since the photoresist layer needs not to be formed again on the photoresist layer formed already as in the example shown in FIG. 1, it is advantageous in that the secondary photoresist layer can be formed easily.

Next, with reference to the first example shown in FIG. 1, formation of the second light emitting part will be explained (FIGS. 1F to 1J). The second light emitting part can be formed by conducting the same process as the above mentioned first light emitting part forming method to the second light emitting layer. At the time, the third light emitting layer coating solution can be coated with the end part "a" of the first light emitting part and the end part "b" of the second light emitting part covered so that color mixture can be prevented.

That is, the second light emitting layer 8 is formed by the same spin coating, or the like, and then, the process of forming the primary photoresist layer 5 is conducted (light emitting layer and primary photoresist layer forming process, FIG. 1F). Next, pattern exposure is conducted by using the primary photomask 6 for masking the part corresponding to the first light emitting part and the part corresponding to the second light emitting part (FIG. 1F). Thereafter, the primary photoresist layer is developed with a photoresist developing agent (primary photoresist layer developing process), and the exposed second light emitting layer is developed (light emitting layer developing process, FIG. 1G). Next, the secondary photoresist layer 5' is formed in a superimposed manner (secondary photoresist layer forming process, FIG. 1H). Then, by conducting the pattern exposure using the wide secondary photomask 6' in the same manner, and developing, the end part "a" of the first light emitting part 4' and the end part "b" of the second light emitting part 8' are formed in a state covered with the secondary photoresist layer 5' (secondary photoresist layer developing process, FIG. 1J). Therefore, at the time of coating the next third light emitting layer coating solution to form the third light emitting layer 9 (FIG. 1K), color mixture of the first light emitting part and the second light emitting part is not generated.

Next, a second example of formation of the above mentioned second light emitting part will be explained (FIGS. 2F to 2J). In the second example, in the case of forming the second the light emitting part, similarly as in the case of the first light emitting part, the photoresist layer peeling process is conducted between the light emitting layer developing process and the secondary photoresist layer forming process.

Figure 2G:
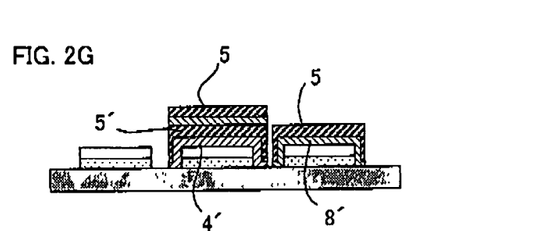
Figure 2H:
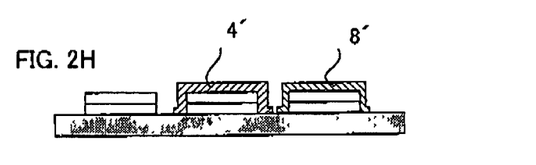
Figure 2I:
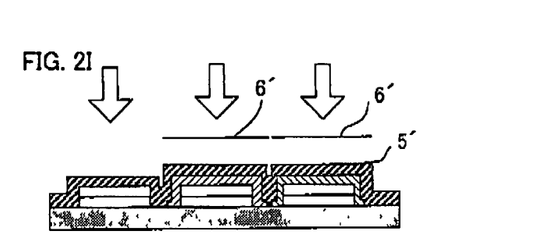
Figure 2J:
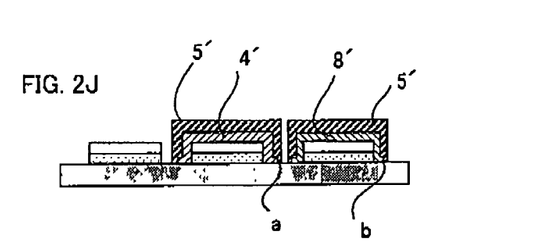

First, as in the first example, the second light emitting layer 8 and primary photoresist layer 5 forming process is conducted (FIG. 2F), and the state with the primary photoresist layer developing process, and the second light emitting layer developing process conducted is FIG. 2G (it corresponds to FIG. 1G). In this state, the primary photoresist layer 5 and the secondary photoresist layer 5' are peeled off (photoresist layer peeling process, FIG. 2H). Next, by forming the secondary photoresist layer 5', and conducting exposure and developing using the wide secondary photomask 6' (FIG. 2I), the first light emitting part 4' up to the end part "a" and the secondary light emitting part 8' up to the end part "b" covered with the secondary photoresist layer 5' can be formed (secondary photoresist layer forming process, secondary photoresist layer developing process, FIG. 2J).

In the second example shown in FIG. 2, as in the case of the above mentioned first light emitting layer, since the secondary photoresist layer forming process is conducted after conducting the photoresist layer peeling process preliminarily, the secondary photoresist layer is not laminated further on the formed primary photoresist layer as shown in FIG. 1. Therefore, it is advantageous in that the secondary photoresist layer can be formed easily.

Figure 2K:
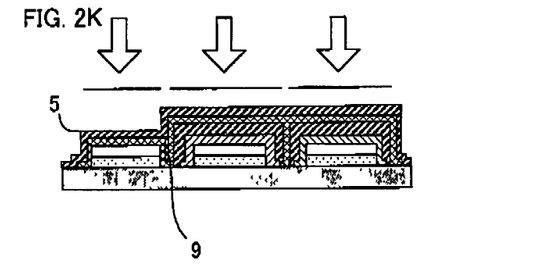

Then, finally, also in the example shown in FIG. 2 as in the example shown in FIG. 1, the light emitting layer forming process and the photoresist forming process for forming the third light emitting layer 9 and the photoresist 5 are conducted (FIG. 1K, FIG. 2K). Then, by conducting the exposure and development of the photoresist, conducting the third light emitting layer developing process, and then peeling off the photoresist, the first light emitting part 4', the second light emitting part 8', and the third light emitting part 9' are formed (FIG. 1L). Finally, as shown in FIG. 1M, by forming the second electrode layer loon these light emitting parts, an EL element which emits the EL light to the downward direction in the figure can be manufactured.

Hereinafter, each process of the method for manufacturing the EL element of the present embodiment will be explained in detail.

1. Light Emitting Layer and Primary Photoresist Layer Forming Process

In this embodiment, first the light emitting layer and photoresist layer forming process is conducted. As shown in the above FIG. 1 and FIG. 2, when the light emitting layer is the first light emitting layer, in general, the first light emitting layer is formed by coating the first light emitting layer coating solution on the base substance with the electrode layer formed.

As the base substance used in the embodiment, one having at least the electrode layer formed is used accordingly, but it is not limited thereto in this embodiment, and one having another organic El layer such as a buffer layer formed can be used as well.

However, in this embodiment, as shown in FIG. 1D to FIG. 1E, at the time of developing the secondary photoresist layer 5', it needs to be conducted in a state with the buffer layer 3 bared. Therefore, in this embodiment, it is preferable that the organic EL layer such as the buffer layer to be formed at this position is an organic El layer not to be eluted into the developing agent of the photoresist layer or the solvent. Specifically, a buffer layer using a sol-gel reacting solution, a photo setting resin, or a thermosetting resin can be presented. That is, a buffer layer not to be eluted in a solvent, obtained by using a buffer layer forming coating solution with additives to make it act as a buffer layer added to a sol-gel reacting solution, a photo setting resin or a thermosetting resin in an uncured state, or a buffer layer forming coating solution prepared so as to act as a buffer layer by modifying a sol-gel reacting solution, a photo setting resin or a thermosetting resin itself, and curing the buffer layer forming coating solution, or the like can be presented.

Hereinafter, each configuration used in the light emitting layer and photoresist layer forming process will be explained specifically.

a. Base Substance

The base substance used in this embodiment is not particularly limited as long as it has high transparency, and an inorganic material such as a glass, a transparent resin, or the like can be used.

The above-mentioned transparent resin is not particularly limited as long as it can be formed like a film, and a polymer material having high transparency, and relatively high solvent resistance and heat resistance is preferable. Specifically, a polyether sulfone, a polyethylene terephthalate (PET), a polycarbonate (PC), a polyetheretherketone (PEEK), a polyvinyl fluoride (PFV), a polyacrylate (PA), a polypropylene (PP), a polyethylene (PE), an amorphous polyolefin, a fluorine based resin, or the like can be presented.

b. Electrode Layer

On the base substance, the electrode layer is formed as mentioned above. The electrode layer is not particularly limited as long as it is one usually used for the El element. The electrode layer provided previously on the base substance may be referred to as the first electrode layer, and the electrode layer provided after formation of the organic EL layer may be referred to as the second electrode layer. It is preferable that these electrode layers comprise an anode and a cathode, with one of the anode or the cathode being transparent or translucent, and the anode is made of a conductive material having a large work function so as to facilitate injection of the hole. Moreover, a plurality of materials may be mixed. In either of the electrode layers, one having a resistance as small as possible is preferable. In general, a metal material is used, but an organic substance or an inorganic compound may be used as well.

c. Light Emitting Layer Costing Solution

In this embodiment, the light emitting layer is formed on the base substance by coating and drying the light emitting layer coating solution on the base substance on which at least the electrode layer is formed.

The light emitting layer coating solution in general is comprised with the additives such as a light emitting material, a solvent, and a doping agent. Since it is a method for manufacturing an EL element of forming a plurality of kinds of light emitting parts on a base substance by patterning light emitting layers of different kinds by a plurality of times by the photolithography method, a plurality of colors of light emitting layers are formed in this embodiment. Therefore, a plurality of kinds of light emitting layer coating solutions is used.

The coating method for the light emitting layer coating solution onto the base substance is not particularly limited as long as it is a coating method capable of coating on the entire surface. For example, a coating operation is conducted by a coating method such as a spin coating method, a casting method, a dipping method, a bar coating method, a blade coating method, a roll coating method, a gravure coating method, a flexo printing method, and a spray coating method.

The coated light emitting layer coating solution is dried and solidified in general by heating, or the like so as to provide a light emitting layer. Hereinafter, each material constituting the light emitting layer coating solution will be explained.

I. Light Emitting Material

The light emitting material used in this embodiment is not particularly limited as long as it contains a material which emits a fluorescent light so as to emit a light, moreover, one having a light emitting function and also a hole transporting function or an electron transporting function can be used as well. In this embodiment, as it is to be described later, since the light emitting layer is patterned by the photolithography method, it is preferable that the material constituting the light emitting layer is a material not to be eluted in a photoresist solvent, a photoresist developing agent, or a photoresist peeling solution to be described later. Moreover, in this case, it is preferable that a material not to be eluted in a solvent used for the formation of the light emitting layer is used as the photoresist used at the time of patterning the light emitting layer by the photolithography method.

As the light emitting material, a dye based material, a metal complex based material, and a polymer based material can be presented.

(1) Dye Based Material

As the dye based material, a cyclopendamine derivative, a tetraphenyl butadiene derivative, a triphenyl amine derivative, an oxadiazol derivative, a pyrazoloquinoline derivative, a distylyl benzene derivative, a distylyl arylene derivative, a sylol derivative, a thiophene ring compound, a pyridine ring compound, a pelynone derivative, a pelylene derivative, an oligothiophene derivative, a trifumanyl amine derivative, an oxadiazol dimmer, a pyrazoline dimmer, or the like can be presented.

(2) Metal Complex Based Material

As the metal complex based material, a metal complex having an Al, a Zn, a Be, or the like, or a rare earth metal such as a Tb, an Eu, a Dy as the central metal, and an oxadiazol, a thiadiazol, a phenyl pyridine, a phenyl benzoimidazol, a quinoline structure, or the like as the ligand, or the like, such as an aluminum quinolinol complex, a benzoquinolinol beryllium complex, a benzoxazol zinc complex, a benzothiazol zinc complex, an azomethyl zinc complex, a porphyline zinc complex, an europium complex, or the like can be presented.

(3) Polymer Based Material

As the polymer based material, a polymer of a polyparaphenylene vinylene derivative, a polythiophene derivative, a polyparaphenylene derivative, a polysilane derivative, a polyacetylene derivative, or the like, a polyfluolene derivative, a polyvinyl carbazol derivative, the above mentioned dye material, and metal complex based light emitting material, or the like can be presented.

In this embodiment, from the viewpoint of utilizing the advantage of accurate formation of the light emitting layer using the light emitting layer coating solution by the photolithography method, it is preferable to use the above mentioned polymer based material as the light emitting material.

II. Solvent

As it is apparent from the examples shown in FIG. 1 and FIG. 2, the light emitting layer coating solution might be coated on the photoresist layer. Therefore, as the solvent used for the light emitting layer coating solution, it is preferable to select a solvent having a solubility with respect to the photoresist at 25° C. and 1 atmospheric pressure of 0.001 (g/g solvent) or less, and it is further preferable to select a solvent having a solubility of 0.0001 (g/g solvent) or less. For example, when the buffer layer to be described later is dissolved in a polarity solvent of water based, DMF, DMSO, alcohol, or the like, and the photoresist is a common novolak based positive resist, aromatic based solvents such as isomers and a mixture of a benzene, a toluene and a xylene, isomers and a mixture of a mesitylene, a tetralin, a p-simene, a cumene, an ethyl benzene, a diethyl benzene, a butylbenzene, a chlorobenzene, and a dichlorobenzene, ether based solvents such as an anisol, a phenetol, a butyl phenyl ether, a tetrahydrofuran, a 2-butanone, a 1,4-dioxane, a diethyl ether, a diisopropyl ether, a diphenyl ether, a dibenzyl ether, and a digrime, chloro based solvents such as a dichloro methane, a 1,1-dichloro ethane, a 1,2-dichloro ethane, a trichloro ethylene, a tetrachloro ethylene, a chloroform, a carbon tetrachloride, and a 1-chloro naphthalene, a cyclo hexanone, or the like can be presented. A solvent other than them can also be used as long as it satisfies the conditions, and a solvent mixture of two or more kinds can be used as well.

Moreover, as it is described later, when a buffer layer soluble in a solvent is used, it is preferable that it dose not dissolve the buffer layer to prevent mixture or dissolution of the buffer layer and the light emitting layer material at the time of forming the light emitting layer and to maintain the light emitting characteristics inherent to the light emitting material.

From these viewpoints, as the solvent for the light emitting layer coating solution, it is preferable to select a solvent having a solubility with respect to the buffer layer material at 25° C. and 1 atmospheric pressure of 0.001 (g/g solvent) or less, and it is further preferable to select a solvent having a solubility of 0.0001 (g/g solvent) or less.

III. Additive

To the light emitting layer coating solution used in this embodiment, in addition to the above mentioned light emitting material and solvent, various additives can be added. For example, a doping material can be added for the purpose of improving the light emitting efficiency in the light emitting layer, changing the light emitting wavelength, or the like. As the doping material, for example, a perylene derivative, a coumarine derivative, a rubrene derivative, a quinacrydone derivative, a squarium derivative, a porphylene derivative, a styryl based dye, a tetracene derivative, a pyrazoline derivative, a decacyclene, a phenoxazone, or the like can be presented.

d. Photoresist

In this embodiment, a primary photoresist layer is formed by coating the photoresist on the entire surface of the base substance with the light emitting layer formed.

The coating method of the photoresist at the time is not particularly limited as long as it is a common method for coating the coating solution on the entire surface. Specifically, coating methods such as a spin coating method, a casting method, a dipping method, a bar coating method, a blade coating method, a roll coating method, a gravure coating method, a flexo printing method, a spray coating method, or the like can be used.

This embodiment is of accordingly forming the primary photoresist layer on the light emitting layer, and patterning the light emitting layer by the photolithography method. The photolithography method is a method for forming an optional pattern according to the light irradiation pattern, utilizing the solubility change of the light irradiation part of the film by the light irradiation.

The photoresist to be used in this embodiment can be a positive type or a negative type, and it is not particularly limited, however, one insoluble to the solvent used for formation of the organic EL layer such as the light emitting layer is preferable.

As the specific photoresist to be used, a novolak resin based one, a rubber+bisazido based one can be presented.

e. Photoresist Solvent

As the photoresist solvent used at the time of coating the photoresist in this embodiment, it is preferable to use one dose not dissolve the organic EL material such as the light emitting layer material for preventing mixture or dissolution of the organic EL layer such as the light emitting layer and the photoresist material at the time of forming the photoresist film, and maintaining the inherent light emitting characteristic. In consideration of this point, as the photoresist solvent usable in this embodiment, it is preferable to select a solvent having a solubility with respect to the organic EL layer forming material such as the light emitting layer forming material at 25° C. and 1 atmospheric pressure of 0.001 (g/g solvent) or less, and it is further preferable to select a solvent having a solubility of 0.0001 (g/g solvent) or less.

For example, as the photoresist solvent usable when the buffer layer forming material is dissolved in a water based solvent and the light emitting layer is dissolved in a nonpolarity organic solvent of an aromatic based one, or the like, ketones such as an acetone, and a methyl ethyl ketone, cellosolve acetates such as a propylene glycol monoethyl ether acetate, a propylene glycol monomethyl ether acetate, an ethylene glycol monomethyl ether acetate, and an ethylene glycol monoethyl ether acetate, cellosolves such as a propylene glycol monomethyl ether, a propylene glycol monomethyl ether, an ethylene glycol monomethyl ether, and an ethylene glycol monoethyl ether, alcohols such as a methanol, an ethanol, a 1-butanol, a 2-butanol, and a cyclohexanol, ester based solvents such as an ethyl acetate, and a butyl acetate, a cyclohexane, a decaline, or the like can be presented. A solvent other than them can also be used as long as it satisfies the conditions, and a solvent mixture of two or more kinds can be used as well.

2. Primary Photoresist Layer Developing Process

Next, in this embodiment, a primary photoresist layer developing process of developing after pattern exposure to the primary photoresist layer is conducted so as to have the photoresist layer corresponding to a predetermined light emitting part remained.

In this process, first, the primary photoresist layer is exposed via a photomask. Since the exposure method, or the like is same as the conventional exposure method, explanation here is omitted. As the photomask, a photomask formed so as to have the photoresist layer in the part which the first light emitting part is to be formed remained. Specifically, in the examples shown in FIG. 1 or FIG. 2, since a positive type photoresist is used, a photomask which shields the light for the part corresponding to the first light emitting part is used.

In contrast, when a negative type photoresist is used, a photomask which exposes only the part corresponding to the first light emitting part is used.

The case of pattern exposure by drawing with a laser light, or the like is conceivable, and this embodiment includes such a case.

Then, after conducting the pattern exposure, the primary photoresist layer is developed. As a result, the photoresist layer is patterned so as to have the primary photoresist layer remain on the first light emitting part.

Hereinafter, the developing agent used for patterning the photoresist layer in this process will be explained.

(Photoresist Developing Agent)

The photoresist developing agent usable in this embodiment is not particularly limited as long a it does not dissolve the material for forming the light emitting layer. Specifically, an organic alkaline based developing agent commonly used can be used. In addition thereto, an inorganic alkaline or an aqueous solution capable of developing the photoresist layer can be used. It is preferable to clean with water after developing the photoresist layer.

As the developing agent usable in this embodiment, a developing agent having a solubility with respect to the light emitting layer forming material at 25° C. and 1 atmospheric pressure of 0.001 (g/g developing agent) or less, and it is further preferable to select a developing agent having a solubility of 0.0001 (g/g developing agent) or less.

3. Light Emitting Layer Developing Process

In this embodiment, a process of forming the light emitting part with the surface covered with the photoresist layer is conducted by removing the bared light emitting layer with the primary photoresist layer removed.

For the light emitting layer developing process, the wet method of using the solvent for dissolving the light emitting layer, and the dry method of using the dry etching can be used. In this embodiment, it is preferable to use the dry method without the trouble of color mixture, or the like. Hereinafter, each method will be explained.

(Wet Method)

The wet method in this case is a method of dissolving and removing the light emitting layer by using a solvent capable of dissolving or peeling off the light emitting layer without peeling off the photoresist. As the solvent usable at the time, the solvents for the above mentioned light emitting layer coating solution can be used, and in addition thereto, other solvents can be selected as long as they are solvents capable of satisfying the conditions.

Moreover, at the time of removing with the solvent, it is possible to carry out in an ultrasonic bath. By accordingly using the ultrasonic bath, highly accurate patterning can be enabled without the trouble of narrowing of the pattern in the light emitting layer, flow out of the light emitting layer, or the like, and it is preferable in terms of allowing highly accurate patterning in a short time.

In this embodiment, the conditions of the ultrasonic used in the ultrasonic bath are preferably execution at a 20 to 100 kilo hertz oscillation frequency for 0.1 to 60 seconds at 25° C. According to the conditions, highly accurate patterning can be enabled in a short time.

(Dry Method)

In contrast, the dry method is a method of removing the light emitting layer in the part with the photoresist removed using the dry etching.

Since the photoresist layer in general is formed considerably thicker than the light emitting layer, the light emitting layer can be removed by dry etching for the entire surface.

In this case, the film thickness of the photoresist layer is preferably in a range of 0.1 to 10 µm, and further preferably in a range of 0.5 to 5 µm. According to the film thickness, dry etching with high processing accuracy can be enabled while maintaining the resist function of the photoresist.

Since the end part of etching can be made sharper by using the dry etching accordingly, the width of the uneven film thickness area existing at the end part of the pattern can be made narrower. As a result, the effect of achieving highly accurate patterning can be provided.

As the dry etching method used in this embodiment, it is preferable that the dry etching is a reactive ion etching. By using the reactive ion etching, the organic film is reacted chemically so as to be a compound having a small molecular weight so that it can be removed from the base substance by vaporization and evaporation, and thus a process with high etching accuracy can be enabled in a short time.

Moreover, in this embodiment, it is preferable to use an oxygen alone or a gas containing an oxygen at the time of the dry etching. By using the oxygen alone or the gas containing an oxygen, decomposition and removing of the organic film by the oxidation reaction can be enabled so that the unnecessary organic substance can be removed from the base substance, and thus a process with high etching accuracy can be enabled in a short time. Moreover, according to this conditions, since the oxide transparent conductive film ordinarily used such as an ITO is not etched, it is effective also in that the electrode surface can be purified without deteriorating the electrode characteristics.

Furthermore, in this embodiment, it is preferable to use the atmospheric pressure plasma for the dry etching. By using the atmospheric pressure plasma, the dry etching, which in generally requires the vacuum equipment, can be conducted under the atmospheric pressure so that shortening of the processing time and reduction of the cost can be achieved. In this case, etching can be carried out by utilizing the oxidation and decomposition of the organic substance by the oxygen as the plasma in the atmosphere, but the gas composition in the reaction atmosphere can be adjusted optionally by substitution and circulation of the gas.

4. Photoresist Layer Peeling Process

In this embodiment, after conducting the light emitting layer developing process, a process of peeling off the developed primary photoresist layer can be conducted. Specifically, as shown in FIGS. 2B to 2C, it is a method of baring the light emitting part by peeling off the primary photoresist layer remaining on the base substance, and conducting the secondary photoresist layer forming process to be described later.

When it is difficult to form the secondary photoresist layer with the primary photoresist layer remaining by laminating thereon, when the film thickness is made thicker by laminating the photoresist layer so as to generate a problem in the subsequent light emitting layer formation, or the like, it is preferable to form the secondary photoresist layer from the state with all the photoresist layer on the base substance once peeled off.

(Photoresist Peeling Solution)

When the photoresist layer is peeled off accordingly, a photo resist peeling solution is used. As the photoresist peeling solution usable in this embodiment, it should not dissolve the light emitting layer, but it should dissolve the photoresist layer, and the above mentioned solvents for the photoresist can be used as they are. Moreover, when a positive type photoresist is used, it is also possible to peel off using the solution presented as the resist developing agents after conducting the UV exposure.

Furthermore, a solvent such as a strong alkaline aqueous solution, a dimethyl formamide, a dimethyl acetamide, a dimethyl sulfoxide, and an N-methyl-2-pyrrolidone, a mixture thereof, or a commercially available resist peeling solution can be used as well. After peeling off the resist, it is rinsed with a 2-propanol, or the like, and it may further be rinsed with water.

5. Secondary Photoresist Layer Forming Process

After conducting the light emitting layer developing process, a process of forming the secondary photoresist layer onto the base substance is conducted so as to cover the light emitting part.

Since the same materials for the above mentioned primary photoresist layer can be used as the secondary photoresist layer used here, explanation here is omitted.

In this embodiment, either the case of using the same photoresist for the primary photoresist layer and the secondary photoresist layer, or the case using different photoresists can be employed. When the above mentioned photoresist layer peeling process is conducted, since the primary photoresist and the secondary photoresist are used independently, it is preferable to use the same photoresist for the reasons that it is simple in terms of the processes, or the like.

In contrast, when the photoresist layer peeling process is not conducted, since the secondary photoresist layer needs to be formed on the primary photoresist layer, depending on the case, different photoresists may be used.

6. Secondary Photoresist Layer Developing Process

The end part "a" of the patterned light emitting part is in a bared state without being covered with the primary photoresist layer in the stage of FIG. 1B and FIG. 2E. When the subsequent light emitting layer coating solution is further coated from this state, the light emitting layer material is eluted form the end part "a" and "b", or the like into the coated light emitting layer coating solution, and as a result, a problem of color mixture or pixel narrowing is generated.

In order to solve the problem, in the secondary photoresist layer exposing and developing process, patterning is conducted so as to cover the light emitting part by a width wider than the width of the primary photoresist layer remained in the primary photoresist exposing and developing process. That is, the secondary photoresist layer is exposed and developed by a size to cover the end part of the light emitting part to an extent not to be on the adjacent light emitting part.

Since the other points are same as the above mentioned primary photoresist layer developing process, explanation here is omitted.

7. Others

In this embodiment, after repeating the above mentioned processes of 1 to 6 for two times, by conducting the light emitting layer forming process and the photoresist layer forming process again as explained for the example of FIG. 1, conducting the exposing and developing process for the formed photoresist layer and the developing process for the formed light emitting layer, and conducting the photoresist layer peeling process, light emitting parts of three colors can be formed.

Then, after forming the second electrode layer and the protection layer, an EL element can be provided by sealing.

B. Second Embodiment

Next, a second embodiment of a method for manufacturing an EL element of the present invention will be explained.

This embodiment is a method for manufacturing an EL element of forming a plurality of kinds of light emitting parts on the base substance by patterning light emitting layers of different kinds by a plurality of times by the photolithography method, on a base substance with an electrode layer formed, comprising at least the following processes.

(1) A process of forming a light emitting layer and a photoresist layer in this order, on the base substance (light emitting layer and primary photoresist layer forming process).

(2) A process of pattern exposing and then developing to the photoresist layer, so as to the part corresponding to all of the light emitting part of the photoresist layer remains (primary photoresist layer developing process).

(3) A process of forming a light emitting part which its surface is covered with the photoresist layer, by removing the light emitting layer which is bared because the photoresist layer is removed (light emitting layer developing process 1).

(4) A process of forming a photoresist layer on the base substance, so as to cover the light emitting part (secondary photoresist layer forming process).

(5) A process of pattern exposing and then developing the photoresist layer, so as not to bare a predetermined light emitting part and the end part thereof (secondary photoresist layer developing process).

(6) A process of removing the light emitting part which is bared because the photoresist layer is removed (light emitting layer developing process 2).

For each of these processes, first, using the first example shown in FIG. 3, formation of the first light emitting part (FIGS. 3A to 3F) will be explained briefly.

FIG. 3 shows the first example of this embodiment. As shown in FIG. 3A, as in the case shown in FIG. 1, a first light emitting layer 4 and a primary photoresist layer 5 are formed on a base substance 1 with an electrode layer 2 and a buffer layer 3 formed (light emitting layer and primary photoresist layer forming process).

Next, the primary photoresist layer is exposed and developed (primary photoresist layer developing process). This embodiment differs drastically from the first embodiment in that a photomask 6 is formed so as to have the primary photoresist layer is remained in all the area with the light emitting part formed (FIG. 3A) in this embodiment in the primary photoresist layer developing process so that development is conducted after exposure with the photomask 6.

Figure 3A:
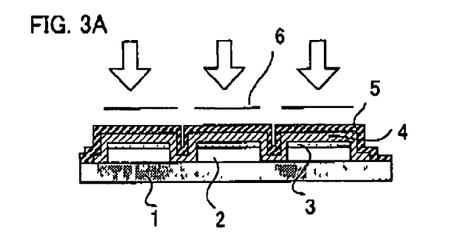
Figure 3B:
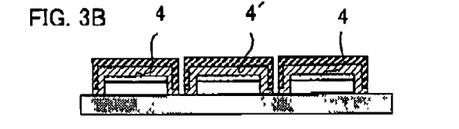

Then, the process of developing the bared first light emitting layer 4 is conducted in a state with the primary photoresist layer 5 remaining in all the area to have the light emitting part formed (light emitting layer developing process 1, FIG. 3B).

Figure 3C:
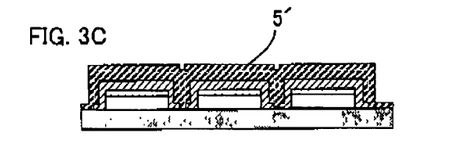
Figure 3D:
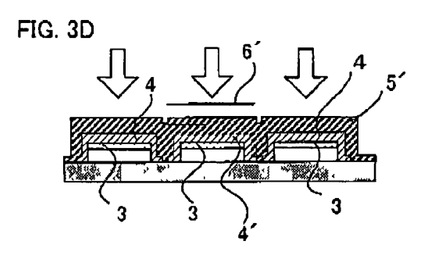

Next, the secondary photoresist layer is formed so as to cover the light emitting part on the base substance (secondary photoresist layer forming process, FIG. 3C).

Figure 3E:
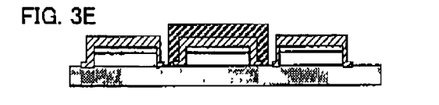

Then, pattern exposure is conducted only in a predetermined light emitting part using a secondary photomask 6' formed wider than the primary photomask 6 (FIG. 3D), and it is developed (secondary photoresist layer developing process FIG. 3E).

Figure 3F:
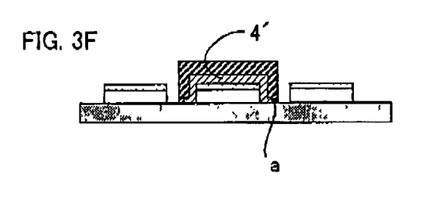
Figure 3G:
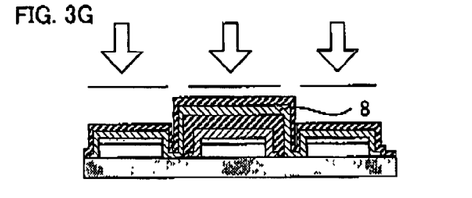
Figure 3H:
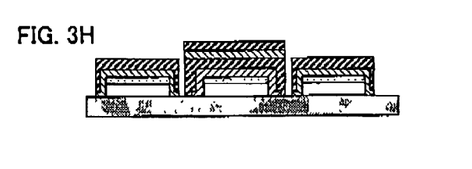
Figure 3I:
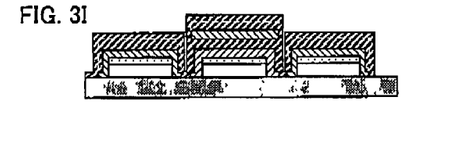
Figure 3J:
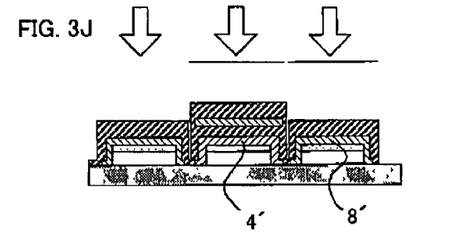

Finally, by developing the light emitting layer remaining on the other light emitting part, the secondary photoresist layer 5' is in a state formed on the first light emitting part 4' so as not to bare the end part "a" thereof (light emitting layer developing process 2, FIG. 3F).

Also in this embodiment, by conducting the photoresist developing processes for two times for the primary photoresist layer and the secondary photoresist layer at the time of patterning one light emitting layer, the coating process for the next second light emitting layer coating solution can be provided in a state with the end part "a" of the first light emitting part 4' covered with the photoresist layer. Therefore, a problem of color mixture, or the like is not generated even when the next second light emitting layer coating solution is coated.

Moreover, it is characteristic of this embodiment that the secondary photoresist layer is developed in a state with the buffer layer 3 covered with the first light emitting layer 4, in the secondary photoresist layer developing process. That is, after the pattern exposure in FIG. 3D, the secondary photoresist layer is developed. At the time, the first light emitting layer 4 exists on the buffer layer (FIG. 3E) so that the photoresist layer developing agent is not contacted directly with the buffer layer. Therefore, in this embodiment, it is advantageous in that a buffer layer made of a material soluble to the photoresist developing agent can be used.

FIG. 4 shows the process to the formation of the first light emitting part in the second example of this embodiment (FIGS. 4A to 4F). In this example, it is completely same to the process of FIG. 3B, that is, up to the process of developing the primary photoresist layer 5 and developing the first light emitting layer (light emitting layer developing process 1) (see FIG. 4B, and it is characterized in that the process of peeling off the developed primary photoresist layer 5 is then conducted (primary resist peeling process, see FIG. 4C).

Figure 3K:
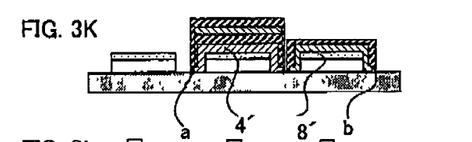
Figure 3L:
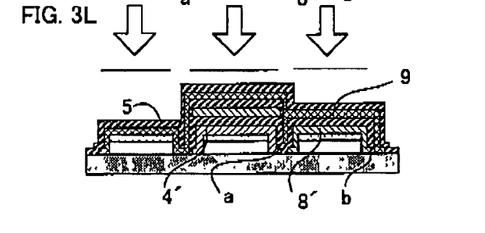
Figure 4A:
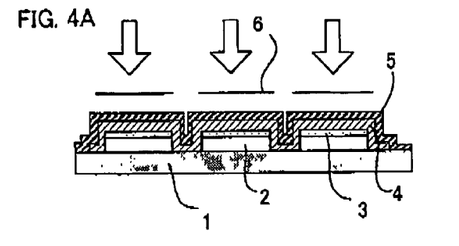
Figure 4B:
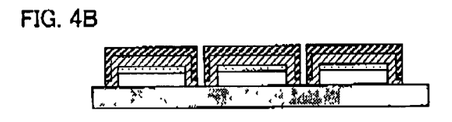
Figure 4C:
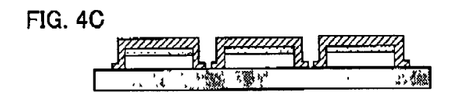
Figure 4D:
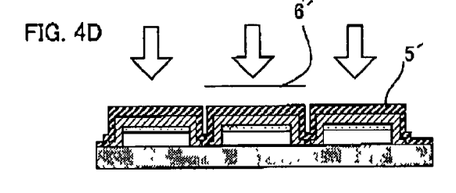
Figure 4E:
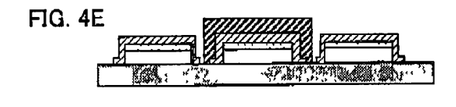
Figures 4F, 4L:
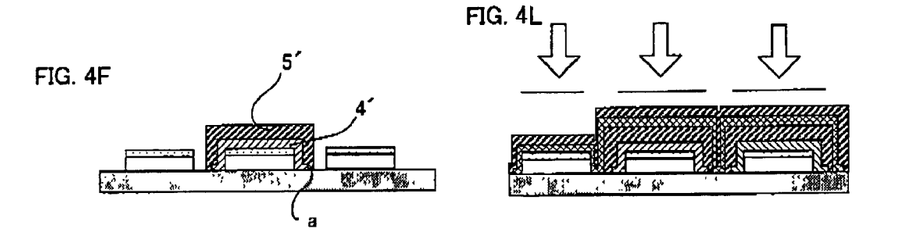
Figure 4G:
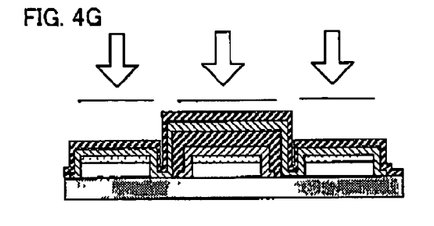
Figure 4H:
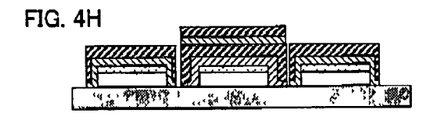
Figure 4I:
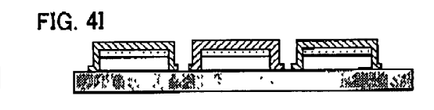
Figure 4J:
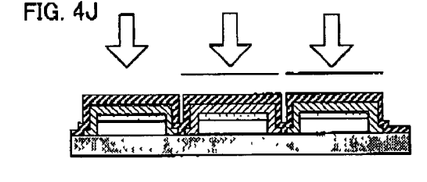
Figure 4K:
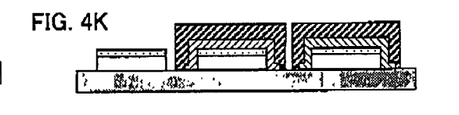

Next, the secondary photoresist layer 5' is formed on the entire surface of the base substance with all the primary photoresist layer removed and the first light emitting part 4' bared. In the same manner as in the example of FIG. 3, the secondary photoresist layer 5' is formed widely using the secondary photomask 6' so as to be in a state with the end part "a" of the first light emitting part 4' covered with the Second photoresist layer 5' without being bared (FIG. 4F).

In the second method, the process of the photoresist layer peeling process should be conducted additionally between the light emitting layer developing 1 process and the photoresist layer forming process. However, since the photoresist layer is not formed again on the photoresist layer already formed as in the example shown in FIG. 3, the secondary photoresist layer can be formed easily. Moreover, since the film thickness is not increased drastically, it is advantageous in that even formation of the light emitting layer is possible.

Moreover, also in the second method, similarly as in the first method, since the light emitting layer 4 exists (FIG. 4E) at the time of developing the primary photoresist layer (FIG. 4D), the buffer layer 3 is not contacted directly with the photoresist developing agent. Therefore, it is advantageous in that a buffer layer soluble to the photoresist developing agent can be used.

Also in this embodiment, similarly as in the case of the first embodiment, by further conducting the same process to the second light emitting layer (FIG. 3G to FIG. 3K), the third light emitting layer coating solution can be coated in a state with the end part "a" of the first light emitting part 4' and the end part "b" of the second light emitting part 8' covered (FIG. 3L) so that color mixture can be prevented. Moreover, similarly as in the first light emitting part forming process, the second light emitting layer 8 exists on the buffer layer at the time of the secondary photolithography layer developing process (FIG. 3J), and the light emitting layer developing process 2 is to be conducted thereafter (FIG. 3K). Therefore, also at the time of forming the second light emitting part, the buffer layer 3 is not directly contacted with the photoresist developing agent.

Moreover, also for the second example of this embodiment, the same process can be conducted similarly to the second light emitting layer (FIGS. 4G to 4K).

Then, after formation of the third light emitting layer and the photoresist layer, by exposing (FIG. 3L and FIG. 4L) and developing, the first light emitting part 4', the second light emitting part 8', and the third light emitting part 9' are formed. Then, finally forming the second electrode layer on the light emitting parts, an EL element which discharges the EL light emission to the downward direction of the figure can be manufactured.

Hereinafter, each process of the method for manufacturing an EL element of this embodiment will be explained in detail. Since the items other than the points specifically pointed out in the explanation below, such as the materials used in this embodiment and the formation method thereof, or the like are same as those explained for the first embodiment, they are omitted in the following explanation for each process.

1. Light Emitting Layer and Primary Photoresist Layer Forming Process

In this embodiment, as in the first embodiment, first, a light emitting layer and primary photoresist layer forming process of forming a light emitting layer and a photoresist layer on a base substance in this order is conducted.

In this embodiment, as it is described later, an organic EL layer soluble to a photoresist developing agent, such as a buffer layer can also be formed on the electrode layer. Such a buffer layer will be explained.

(Buffer Layer)

The buffer layer in this embodiment is a layer containing an organic substance, in particular, an organic conductive substance is provided in between an anode and a light emitting layer or a cathode and a light emitting layer so as to facilitate injection of the charge into the light emitting layer. For example, it can be provided as a conductive polymer having the function of improving the hole injection efficiency into the light emitting layer so as to flatten the roughness of the electrode, or the like.

When the conductivity of the buffer layer used in this embodiment is high, it is preferable that it is patterned so as to maintain the element diode characteristic, and to prevent cross talk. When the resistance of the buffer layer is high, or the like, it is not necessary be patterned in some cases, and moreover, in the case of an element capable of omitting the buffer layer, the buffer layer is not necessary be provided in some cases.

In this embodiment, when both the buffer layer and the light emitting layer are formed by patterning by the photolithography method, it is preferable to select a material, forming the buffer layer, insoluble to the photoresist solvent and the solvent used for the light emitting layer formation. More preferably, it is the case of selecting a material, forming the buffer layer, insoluble to the photoresist peeling solution.

As the material forming the buffer layer used in this embodiment, specifically, polymers of a hole transporting substance such as a polyalkyl thiophene derivative, a polyaniline derivative and a triphenyl amine, sol-gel films of an inorganic oxide, polymer films of an organic substance such as a trifluoro methane, organic compound films containing a Lewis acid, or the like can be presented, but it is not particularly limited as long as it satisfies the conditions concerning the above mentioned solubility, and it may satisfy the above mentioned conditions by reaction by polymerization, baking or the like after the film formation.

Moreover, in this embodiment, as the solvent used at the time of forming the buffer layer, one having the buffer material dispersed or dissolved can be used, and it is not particularly limited. When film formation is needed by a plurality of times in full color patterning, or the like, it is necessary to use a buffer layer solvent which dose not dissolve the photoresist material, and it is further preferable to use a buffer layer solvent which does not dissolve the light emitting layer.

As the buffer layer solvent usable in this embodiment, it is preferable to select a solvent having a solubility with respect to the resist material at 25° C. and 1 atmospheric pressure of 0.001 (g/g solvent) or less, and it is further preferable to select a solvent having a solubility of 0.0001 (g/g solvent) or less. Moreover, as the buffer layer solvent, it is further preferable to select a solvent having a solubility with respect to the light emitting layer component material at 25° C. and 1 atmospheric pressure of 0.001 (g/g solvent) or less, and it is particularly preferable to select a solvent having a solubility of 0.0001 (g/g solvent) or less.

Specifically, water, alcohols such as a methanol and an ethanol, and solvents such as a dimethyl formamide, a dimethyl acetamide, a dimethyl sulfoxide, and an N-methyl-2-pyrrolidone can be presented. Other solvents capable of satisfying the conditions can be used as well. Moreover, a mixture of two or more kinds of solvents can be used as well.

2. Primary Photoresist Layer Developing Process

Next, a primary photoresist layer developing process of pattern exposure and then development is conducted so as the photoresist layer in the part corresponding to all of the light emitting part, out of the formed photoresist layer, are remained.

This process is a process drastically different from the first embodiment. The first embodiment is conducted so as to have the photoresist layer remained in the part corresponding to the part of a predetermined light emitting part, whereas in this embodiment, pattern exposure and development are conducted so as to have the photoresist layer in the part corresponding to all of the light emitting part remained.

3. Light Emitting Layer Developing Process 1

Then, as mentioned above, by removing the light emitting layer which is bared because the photoresist layer is removed, a light emitting layer developing process 1, for forming the light emitting part with the surface covered with the photoresist layer, is conducted.

Accordingly, by conducting the light emitting layer developing process 1 after conducting the primary photoresist layer forming process, the light emitting layer existing in between the part corresponding to the light emitting part covered with the primary photoresist layer can be removed.

In the above mentioned process 2 and in this process, by thus keeping the light emitting part, that is, the light emitting layer at part on which the buffer layer exist, and removing the light emitting layer existing in between, the end part of the light emitting part is covered with the secondary photoresist layer to be formed in the subsequent process, and at the same time, the buffer layer can be protected by the light emitting layer in the subsequent secondary photoresist layer developing process.

4. Photoresist Layer Peeling Process

Also in this embodiment, similarly to the first embodiment, the process of peeling off the developed primary photoresist layer may be conducted after conducting the light emitting layer developing process. When it is difficult to form the secondary photoresist layer with the primary photoresist layer remaining by laminating thereon, or when the film thickness is made thicker by laminating the photoresist layer, causing to generate a problem in the subsequent light emitting layer formation, or the like, it is preferable to form the secondary photoresist layer in the state with all of the photoresist layer on the base substance once peeled off.

5. Secondary Photoresist Layer Forming Process

Next, the secondary photoresist layer forming process for forming the photoresist layer so as to cover the above mentioned light emitting part on the base substance is conducted.

Thereby, as mentioned above, the light emitting part end part is covered with the secondary photoresist layer.

6. Secondary Photoresist Layer Developing Process

Then, the secondary photoresist layer developing process of development after pattern exposure of the photoresist layer so as not to bare a predetermined light emitting part and the end part thereof is conducted. In this process, since the buffer layer located on the electrode layer, that is, in the area to have the light emitting part formed is covered with the light emitting layer at the time of developing the secondary photoresist layer, it is not contacted directly with the photoresist layer developing agent to be used in this secondary photoresist layer developing process. Therefore, according to this embodiment, a buffer layer soluble to the photoresist layer developing agent, or the like as mentioned above can be used.

7. Light Emitting Layer Developing Process 2

Next, the light emitting part developing process 2 of removing the bared light emitting part with the photoresist layer removed, is conducted.

In this embodiment, by accordingly conducting the light emitting layer developing process in two times, the buffer layer is covered with the light emitting layer without being bared in the photoresist layer developing process.

In this embodiment, the light emitting layer developing process is conducted additionally for one time compared with the first embodiment. However, for the improvement of the light emitting efficiency, or the like, a buffer layer soluble to a solvent needs to be formed in some cases, and this embodiment is an embodiment useful in that case.

The present invention is not limited to the above mentioned embodiments. The above mentioned embodiments are examples, and any one having the substantially same configuration as the technological idea disclosed in the claims of the present invention, and providing the same effects is included in the technological scope of the present invention.

EXAMPLES

Next, with reference to the examples, the present invention will be explained in further detail.

Example 1

Example

Film Formation of the Buffer Layer

By cleaning a patterned ITO substrate of a 6 inch square and 1.1 mm plate thickness, abase substance and a first electrode layer were provided. 0.5 ml of a buffer layer coating solution (manufactured by Bayer Corp; Baytron P, shown in the below mentioned chemical formula (1)) was taken and dropped onto the central part of the base substance for conducting spin coating. By maintaining at 2,500 rpm for 20 seconds, a layer was formed. As a result, the film thickness was 800 angstrom.

(1)

(Film Formation of the First Light Emitting Layer)

As the first light emitting layer, 1 ml of a coating solution (70 parts by weight of a polyvinyl carbazol, 30 parts by weight of an oxadiazol, 1 part by weight of a dicyanomethylene pyran derivative, 4,900 parts by weight of a monochloro benzene) as a red color light emitting organic material was taken and dropped onto the central part of the base substance on the buffer layer and conducted the spin coating. By maintaining at 2,000 rpm for 10 seconds, a layer was formed. As a result, the film thickness was 800 angstrom.

2 ml of a positive type photoresist solution (manufactured by Tokyo Ohka Kogyo Co., Ltd.; OFPR-800) was taken and dropped onto the central part of the base substance, and conducted the spin coating. By maintaining at 500 rpm for 10 seconds, and then at 2,000 rpm for 20 seconds, a layer was formed. As a result, the film thickness was about 1 μm. Pre-baking was conducted at 80° C. for 30 minutes. Thereafter, it was set on an alignment exposing machine together with an exposure mask for the ultraviolet ray irradiation in the part which the buffer layer and the light emitting layer are desired to be removed. After developing for 20 seconds with a resist developing agent (manufactured by Tokyo Ohka Kogyo Co., Ltd.; NMD-3), it was cleaned with water to remove the photoresist layer in the exposed part. After post-baking at 120° C. for 30 minutes, the buffer layer and the light emitting layer in the part, with the photoresist layer removed, were removed by the reactive ion etching using an oxygen plasma. After totally removing the photoresist layer with an acetone, 2 ml of a positive type photoresist solution (manufactured by Tokyo Ohka Kogyo Co., Ltd.; OFPR-800) was taken and dropped again onto the central part of the base substance, and conducted the spin coating. By maintaining at 500 rpm for 10 seconds, and then at 2,000 rpm for 20 seconds, a layer was formed. As a result, the film thickness was about 1 μm. Pre-baking was conducted at 80° C. for 30 minutes. Thereafter, it was set on the alignment exposing machine together with an exposure mask for the ultraviolet ray irradiation so as to have the photoresist layer remained by a width larger than the width of the first light emitting part by 10 μm each. After developing for 20 seconds with a resist developing agent (manufactured by Tokyo Ohka Kogyo Co., Ltd.; NMD-3), it was cleaned with water, to remove the photoresist layer in the exposed part. By post-baking at 120° C. for 30 minutes, the base substance protected by the photoresist layer having the first light emitting part with a width larger than the width of the first light emitting part by 10 μm each was obtained.

(Film Formation of the Second Buffer Layer)

0.5 ml of a buffer layer coating solution (manufactured by Bayer Corp.; Baytron P) was taken and dropped onto the central part of the obtained base substance, and conducted the spin coating. By maintaining at 2,500 rpm for 20 seconds, a layer was formed. As a result, the film thickness was 800 angstrom.

(Film Formation of the Second Light Emitting Layer)

As the second light emitting layer, 1 ml of a coating solution (70 parts by weight of a polyvinyl carbazol, 30 parts by weight of an oxadiazol, 1 part by weight of a coumarine 6, 4,900 parts by weight of a monochloro benzene) as a green color light emitting organic material was taken and dropped onto the central part of the base substance on the buffer layer, and conducted the spin coating. By maintaining at 2,000 rpm for 10 seconds, a layer was formed. As a result, the film thickness was about 800 angstrom.

2 ml of a positive type photoresist solution (manufactured by Tokyo Ohka Kogyo Co., Ltd.; OFPR-800) was taken and dropped onto the central part of the base substance, and conducted the spin coating. By maintaining at 500 rpm for 10 seconds, and then at 2,000 rpm for 20 seconds, a layer was formed. As a result, the film thickness was about 1 µm. Pre-baking was conducted at 80° C. for 30 minutes. Thereafter, it was set on the alignment exposing machine together with an exposure mask for the ultraviolet ray irradiation in the part which the light emitting layer is desired to be removed, except the first light emitting part and the second light emitting part. After developing for 20 seconds with a resist developing agent (manufactured by Tokyo Ohka Kogyo Co., Ltd.; NMD-3), it was cleaned with water to remove the photoresist layer in the exposed part. After post-baking at 120° C. for 30 minutes, the buffer layer and the light emitting layer, in the part with the photoresist layer removed, were removed by the reactive ion etching using an oxygen plasma. After removing the photoresist with an acetone, 2 ml of a positive type photoresist solution (manufactured by Tokyo Ohka Kogyo Co., Ltd.; OFPR-800) was taken and dropped again onto the central part of the base substance, and conducted the spin coating. By maintaining at 500 rpm for 10 seconds, and then at 2,000 rpm for 20 seconds, a layer was formed. As a result, the film thickness was about 1 µm. Pre-baking was conducted at 80° C. for 30 minutes. Thereafter, it was set on the alignment exposing machine together with an exposure mask for the ultraviolet ray irradiation so as to have the photoresist layer remained by a width larger than the width of the first light emitting part and the second light emitting part by 10 µm each. After developing for 20 seconds with a resist developing agent (manufactured by Tokyo Ohka Kogyo Co., Ltd.; NMD-3), it was cleaned with water to remove the photoresist in the exposed part. By post-baking at 120° C. for 30 minutes, the base substance protected by the photoresist with a width larger than the width of the first light emitting part and the second light emitting part by 10 µm each was obtained.

(Film Formation of the Third Buffer Layer)

0.5 ml of a buffer layer coating solution (manufactured by Bayer Corp.; Baytron P) was taken and dropped onto the central part of the base substance on the obtained base substance, and conducted the spin coating. By maintaining at 2,500 rpm for 20 seconds, a layer was formed. As a result, the film thickness was 800 angstrom.

(Film Formation of the Third Light Emitting Layer)

As the third light emitting layer, 1 ml of a coating solution (70 parts by weight of a polyvinyl carbazol, 30 parts by weight of an oxadiazol, 1 part by weight of a perylene, 4,900 parts by weight of a monochloro benzene) as a blue color light emitting organic material was taken and dropped onto the central part of the base substance on the buffer layer, and conducted the spin coating. By maintaining at 2,000 rpm for 10 seconds, a layer was formed. As a result, the film thickness was 800 angstrom.

2 ml of a positive type photoresist solution (manufactured by Tokyo Ohka Kogyo Co., Ltd.; OFPR-800) was taken and dropped onto the central part of the base substance, and conducted the spin coating. By maintaining at 500 rpm for 10 seconds, and then at 2,000 rpm for 20 seconds, a layer was formed. As a result, the film thickness was about 1 µm. Pre-baking was conducted at 80° C. for 30 minutes. Thereafter, it was set on the alignment exposing machine together with an exposure mask for the ultraviolet ray irradiation in the part which the light emitting layer is desired to be removed, except the first light emitting part, the second light emitting part, and the third light emitting part. After developing for 20 seconds with a resist developing agent (manufactured by Tokyo Ohka Kogyo Co., Ltd.; NMD-3), it was cleaned with water to remove the photoresist layer in the exposed part. After post-baking at 120° C. for 30 minutes, the buffer layer and the light emitting layer, in the part with the photoresist layer removed, were removed by the reactive ion etching using an oxygen plasma so as to obtain the base substance with the first light emitting part, the second light emitting part and the third light emitting part protected by the photoresist. Thereafter, the photoresist was totally removed with an acetone so as to bare the patterned light emitting layer.

After drying at 100° C. for 1 hour, by depositing a Ca by 500 angstrom thickness as the second electrode layer (upper electrode) on the obtained base substance, and further depositing an Ag by 2,500 angstrom thickness as the protection layer, an EL element was manufactured.

(Evaluation of the Light Emitting Characteristic of the EL Element)

With the ITO electrode side connected with the positive electrode and the Ag electrode side with the negative electrode, a direct current was applied by a source meter. Light emission was observed from the first light emitting part, the second light emitting part and the third light emitting part respectively at the time of applying 10 V.

Comparative Example

In the same manner as in the example 1 except that the photoresist layer peeling process, formation of the secondary photoresist layer, and re-protection of the light emitting layer in the exposure and developing process were not conducted after the first light emitting layer and second light emitting layer developing process, an EL element was manufactured. At the time of developing the second light emitting layer and the third light emitting layer, the light emitting layer already patterned was eluted so as to generate pixel narrowing.

The invention claimed is:

1. A method for manufacturing an electroluminescent element comprising:
   a process of forming a light emitting layer and a primary photoresist layer in this order, on a base substance;
   a process of pattern exposing and then developing the primary photoresist layer, so as to a part corresponding to a predetermined light emitting part of the primary photoresist layer remains;
   a process of forming a light emitting part surface which is covered with the primary photoresist layer and a light emitting end part surface not covered with the primary photoresist layer, by removing the light emitting layer which is bared because the primary photoresist layer is removed;

a process of forming a secondary photoresist layer so as to avoid a contact between the light emitting part surface and a light emitting layer formed outside thereof, the light emitting end part surface and a light emitting layer formed outside thereof and to cover the light emitting part surface and the light emitting end part surface; and a process of pattern exposing and then developing the secondary photoresist layer, so as to avoid the contact between the light emitting part surface and the light emitting layer formed outside thereof, the light emitting end part surface and the light emitting layer formed outside thereof and not to bare the light emitting part surface and the light emitting end part surface from the secondary photoresist layer, wherein a plurality of kinds of light emitting parts are formed on the base substance by patterning light emitting layers of different kinds by a plurality of times by a photolithography method, on the base substance with an electrode layer formed.

2. A method for manufacturing an electroluminescent element comprising:

a process of forming a light emitting layer and a primary photoresist layer in this order, on a base substance;

a process of pattern exposing and then developing the primary photoresist layer, so as to a part corresponding to a predetermined light emitting part of the primary photoresist layer remains;

a process of forming a light emitting part surface which is covered with the primary photoresist layer and a light emitting end part surface not covered with the primary photoresist layer, by removing the light emitting layer which is bared because the primary photoresist layer is removed;

a process of baring the light emitting part by peeling the primary photoresist layer remaining on the light emitting part;

a process of forming a secondary photoresist layer on the base substance with the bared light emitting part formed, so as to avoid a contact between the light emitting part and a light emitting layer formed outside thereof and to cover the light emitting part; and a process of pattern exposing and then developing the secondary photoresist layer, so as to avoid the contact between the light emitting part surface and the light emitting layer formed outside thereof, the light emitting end part surface and the light emitting layer formed outside thereof and not to bare the light emitting part surface and the light emitting end part surface from the secondary photoresist layer, wherein a plurality of kinds of light emitting parts are formed on the base substance by patterning light emitting layers of different kinds by a plurality of times by a photolithography method, on the base substance with an electrode layer formed.

3. A method for manufacturing an electroluminescent element comprising:

a process of forming a light emitting layer and a primary photoresist layer in this order, on a base substance;

a process of pattern exposing and then developing the primary photoresist layer, so as to a part corresponding to all of the light emitting part of the primary photoresist layer remains;

a process of forming a light emitting part surface which is covered with the primary photoresist layer and a light emitting end part surface not covered with the primary photoresist layer, by removing the light emitting layer which is bared because the primary photoresist layer is removed;

a process of forming a secondary photoresist layer so as to avoid a contact between the light emitting part surface and a light emitting layer formed outside thereof, the light emitting end part surface and a light emitting layer formed outside thereof and to cover the light emitting part surface and the light emitting end part surface; and a process of pattern exposing and then developing the secondary photoresist layer, so as to avoid the contact between a predetermined light emitting part surface and the light emitting layer formed outside thereof, a predetermined light emitting end part surface and the light emitting layer formed outside thereof and not to bare the predetermined light emitting part surface and the predetermined light emitting end part surface from the secondary photoresist layer, and thereby removing the primary photoresist layer and the secondary photoresist layer other than the predetermined light emitting part; and a process of removing the light emitting part which is bared because the primary photoresist layer and the secondary photoresist layer are removed, wherein a plurality of kinds of light emitting parts are formed on the base substance by patterning light emitting layers of different kinds by a plurality of times by a photolithography method, on the base substance with an electrode layer formed.

4. A method for manufacturing an electroluminescent element comprising:

a process of forming a light emitting layer and a primary photoresist layer in this order, on a base substance;

a process of pattern exposing and then developing the primary photoresist layer, so as to a part corresponding to all of the light emitting part of the primary photoresist layer remains;

a process of forming a light emitting part surface which is covered with the primary photoresist layer and a light emitting end part surface not covered with the primary photoresist layer, by removing the light emitting layer which is bared because the primary photoresist layer is removed;

a process of baring all of the light emitting part by peeling off the primary photoresist layer remaining on all of the light emitting part;

a process of forming a secondary photoresist layer on the base substance with the bared light emitting part formed, so as to avoid a contact between the light emitting part and a light emitting layer formed outside thereof and to cover the light emitting part;

a process of pattern exposing and then developing the secondary photoresist layer, so as to avoid the contact between a predetermined light emitting part surface and the light emitting layer formed outside thereof, a predetermined light emitting end part surface and the light emitting layer formed outside thereof and not to bare the predetermined light emitting part surface and the predetermined light emitting end part surface from the secondary photoresist layer, and thereby removing the secondary photoresist layer other than the predetermined light emitting part; and a process of removing the light emitting part which is bared because the secondary photoresist layer is removed, wherein a plurality of kinds of light emitting parts are formed on the base substance by patterning light emitting layers of different kinds by a plurality of times by a photolithography method, on the base substance with an electrode layer formed.

5. The method for manufacturing an electroluminescent element according to claim 1, wherein the process of removing the light emitting layer or light emitting part which is bared because the photoresist layer is removed, is a process of removing by dry etching.

6. The method for manufacturing an electroluminescent element according to claim 2, wherein the process of removing the light emitting layer or light emitting part which is bared because the photoresist layer is removed, is a process of removing by dry etching.

7. The method for manufacturing an electroluminescent element according to claim 3, wherein the process of removing the light emitting layer or light emitting part which is bared because the photoresist layer is removed, is a process of removing by dry etching.

8. The method for manufacturing an electroluminescent element according to claim 4, wherein the process of removing the light emitting layer or light emitting part which is bared because the photoresist layer is removed, is a process of removing by dry etching.

* * * * *